United States Patent [19]
McMillan et al.

[11] Patent Number: 5,523,964
[45] Date of Patent: Jun. 4, 1996

[54] FERROELECTRIC NON-VOLATILE MEMORY UNIT

[75] Inventors: Larry D. McMillan, Colorado Springs, Colo.; Takashi Mihara, Saitama; Hiroyuki Yoshimori, Kanagawa, both of Japan; John W. Gregory; Carlos A. Paz de Araujo, both of Colorado Springs, Colo.

[73] Assignees: Symetrix Corporation, Colorado Springs, Colo.; Olympus Optical Co., Ltd., Japan

[21] Appl. No.: 224,241

[22] Filed: Apr. 7, 1994

[51] Int. Cl.⁶ .................. G11C 11/22; H01L 29/788; H01L 29/792
[52] U.S. Cl. .................. 365/145; 365/117; 257/295
[58] Field of Search .................. 365/145, 117, 365/149; 257/295, 310

[56] References Cited

U.S. PATENT DOCUMENTS

| | | | |
|---|---|---|---|
| 2,791,760 | 5/1957 | Ross | 340/173 |
| 2,791,761 | 5/1957 | Morton | 340/173 |
| 3,832,700 | 8/1974 | Wu et al. | 340/173.5 |
| 4,161,038 | 7/1979 | Wu | 365/145 |
| 4,888,630 | 12/1989 | Paterson | 357/23.5 |
| 5,038,323 | 8/1991 | Schwee | 365/145 |
| 5,198,994 | 3/1993 | Natori | 365/145 |
| 5,227,855 | 7/1993 | Momose | 365/145 |
| 5,303,182 | 4/1994 | Nakao | 365/145 |

FOREIGN PATENT DOCUMENTS

| | | |
|---|---|---|
| 2-185789 | 7/1990 | Japan . |
| 5-90532 | 9/1991 | Japan . |
| 4-199745 | 7/1992 | Japan . |
| 5-145077 | 6/1993 | Japan . |
| WO91/13465 | 9/1991 | WIPO . |

OTHER PUBLICATIONS

P. Arnett, "Ferroelectric FET Device", Feb. 1973, IBM Technical Disclosure Bulletin, vol. 15, No. 9.

*Primary Examiner*—David C. Nelms
*Assistant Examiner*—Son Mai
*Attorney, Agent, or Firm*—Duft, Graziano & Forest

[57] ABSTRACT

An integrated circuit non-volatile, non-destructive read-out memory unit includes a ferroelectric capacitor having first and second electrodes, a capacitance Cf, and an area Af, and a transistor having a gate, a source and a drain forming a gate capacitor having an area Ag and a gate capacitance Cg, a gate overlap b, and a channel depth a, with the capacitor first electrode connected to the gate of the transistor. The ferroelectric material has a dielectric constant $\epsilon f$ and the gate insulator has a dielectric constant $\epsilon g$. A source of a constant reference voltage is connectable to the first electrode. A bit line connects to the second electrode. In one embodiment the first electrode and gate are the same conductive member. In another embodiment the second electrode and the gate are the same conductive member and the first electrode is formed by extensions of the transistor source and drains underlying the gate, with the ferroelectric material between the source and drain extensions and the gate. The memory unit has the parametric relationships: $Cf < 5 \times Cg$, $Af \leq 2Ag$, $b \geq 2a$, and $\epsilon g \geq \epsilon f/8$.

21 Claims, 9 Drawing Sheets

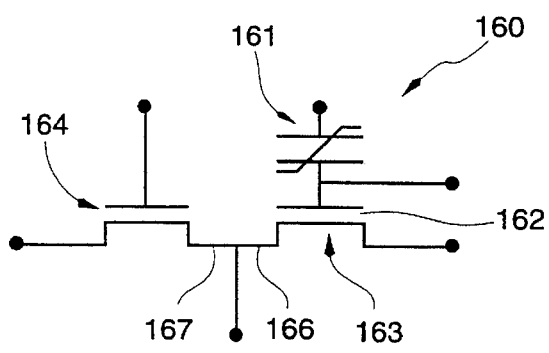
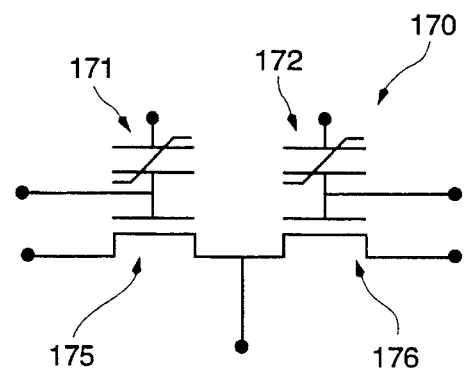
FIG. 16  FIG. 17
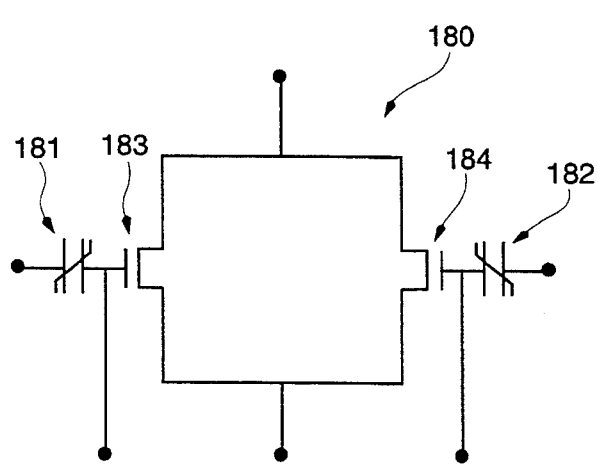
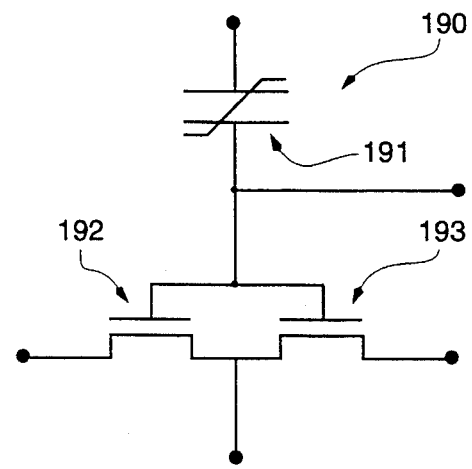
FIG. 18  FIG. 19
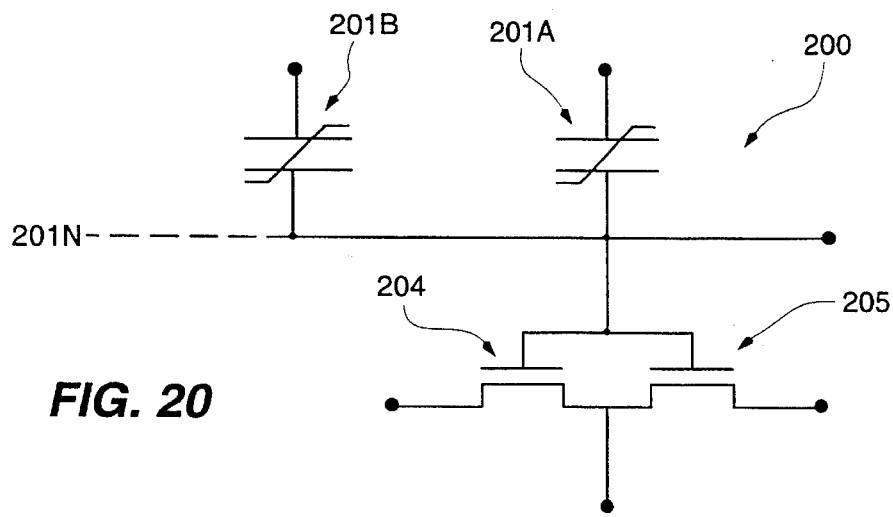
FIG. 20

FERROELECTRIC NON-VOLATILE MEMORY UNIT

BACKGROUND OF THE INVENTION

1. Field of the Invention

The invention in general relates to non-volatile electronic memories and more particularly to a memory having a memory cell including a ferroelectric capacitor and a transistor with one electrode of the capacitor connected to the gate of the transistor.

2. Statement of the Problem

It is well-known that ferroelectric materials are capable of retaining a polarization which can be used to store information in a non-volatile memory. An early proposal for a non-volatile ferroelectric device thin could be used to store information was a switch made by placing a ferroelectric crystal across one or more p-n junctions. See U.S. Pat. Nos. 2,791,760 issued to I. M. Ross and 2,791,761 issued to J. A. Moron. In these disclosures, it is proposed that the different polarizations of the ferroelectric material will differently affect the current carried by the junction thus providing a bistable switch that can be used to store information. However, no disclosure of how this device could be incorporated into a memory is provided.

The most common design for non-volatile ferroelectric memories is to simply replace the dielectric material in a conventional DRAM with a ferroelectric material. See for example U.S. Pat. No. 5,038,323 issued to Leonard J. Schwee. Such memories are destructive-read-out (DRO) memories in that the memory state is altered when read. Such memories must be switched each time they are read, which switching tends to cause the memories to fail. Thus, such memories have not yet been commercially successful.

Non-volatile memories which incorporate a ferroelectric material between the gate of a transistor and the semiconducting substrate, sometimes referred to as ferroelectric FETs, have also been proposed. See U.S. Pat. Nos. 3,832,700 issued to Shu-Yau Wu et al., 4,161,038 issued to Shu-Yau Wu, 5,198,994 issued to Kenji Natori, and the article "Ferroelectric FET Device" by P. Arnett, *IBM Technical Disclosure Bulletin*, Vol. 15, No. 9, Feb. 1973, p. 2825. In the Wu references and some embodiments of the Natori reference the ferroelectric material is deposited directly on a silicon substrate. In some embodiments of the Natori reference and the Arnett reference an insulator is placed between the substrate and the ferroelectric material. Another approach is to sandwich the ferroelectric material between the floating gate and control gate of an EEPROM device. See U.S. Pat. No. 4,888,630 issued to James L. Paterson. However, such devices have remained essentially theoretical possibilities, since they have not been able to retain programmed threshold voltage levels for more than a few minutes, and devices have utility as non-volatile memory elements only if information can be stored for long periods of time. The short retention period for the ferroelectric FET devices is believed to be due to the fact that the transistor configurations inhibit polarization saturation of the ferroelectric layer. Application of a bias between the gate electrode and the substrate establishes different electric fields across the ferroelectric layer, the gate insulating layer (if present), and the channel region of the transistor. The amount of field drop across each layer is inversely proportional to the dielectric constant and thickness of the layer. The highest electric field will develop across the layer with the lowest dielectric constant. Because the dielectric constant of silicon is about 11.7, the dielectric constant of silicon dioxide is about 3.9, and the dielectric constants of most ferroelectrics is greater than 100, most of the field drop occurs across the silicon dioxide and the silicon channel region. Thus, at the 3 volt to 5 volt voltages used in conventional integrated circuits, insufficient field develops across the ferroelectric layer to fully saturate the polarization. With such a weakly polarized ferroelectric, stray fields created in reading the cell and in writing to the cells in the same row and column quickly destroy any memory that exists.

Japanese patent application No. 3-247714 shows a memory cell in which a the gate of a MOS-FET transistor is connected to one side of a ferroelectric capacitor, the word line is connected to the other side of the ferroelectric capacitor, and the bit line is connected between the gate and the capacitor. It is not described how such a memory operates, but since the word line connects directly to the ferroelectric capacitor, the state of polarization of the capacitor will be switched or significantly affected each time the row in which the memory cell is located is addressed. Thus this approach appears to be another essentially theoretical device which cannot long retain a memory state.

3. Solution to the problem

The present invention solves the above problem by providing memory units in which saturated polarization is obtained and in which the state of the cell is not affected by any read or write operations, except the write operation to the particular cell being addressed.

In one embodiment, the invention provides a four-terminal memory unit comprising a ferroelectric capacitor and a transistor with the capacitor connected to the gate of the transistor. In this embodiment the electrodes of the capacitor are conductive layers that are distinct from the gate of the transistor. Two of the terminals are directly connected to the capacitor electrodes and are used to write information into the capacitor. The two others are used to read information from the transistor.

In an implementation of the memory unit according to the invention in an integrated circuit, one plate of the ferroelectric capacitor is formed by the same conductive layer as the gate of the transistor. In another implementation, one electrode of the capacitor is formed by the gate of the transistor and the other electrode is formed by heavily doped portions of the transistor active regions that underlie the gate and ferroelectric layer.

The fact that in each of the above embodiments no low dielectric constant insulating material separates the capacitor electrodes and the ferroelectric material, results in the ability to saturate the polarization of the ferroelectric material with conventional integrated circuit voltages. Further, the highly conducting electrodes that completely, or nearly completely, sandwich the ferroelectric material in each of the embodiments, prevents stray fields in the read process and in writing to other cells from affecting the polarized ferroelectric. Numerous other features, objects and advantages of the invention will become apparent from the following description when read in conjunction with the accompanying drawings.

BRIEF DESCRIPTION OF THE DRAWINGS

FIGS. 16 through 21 show electrical circuit diagrams of six different alternative embodiments of a memory unit according to the invention;

DESCRIPTION OF THE PREFERRED EMBODIMENT

Figure 1:
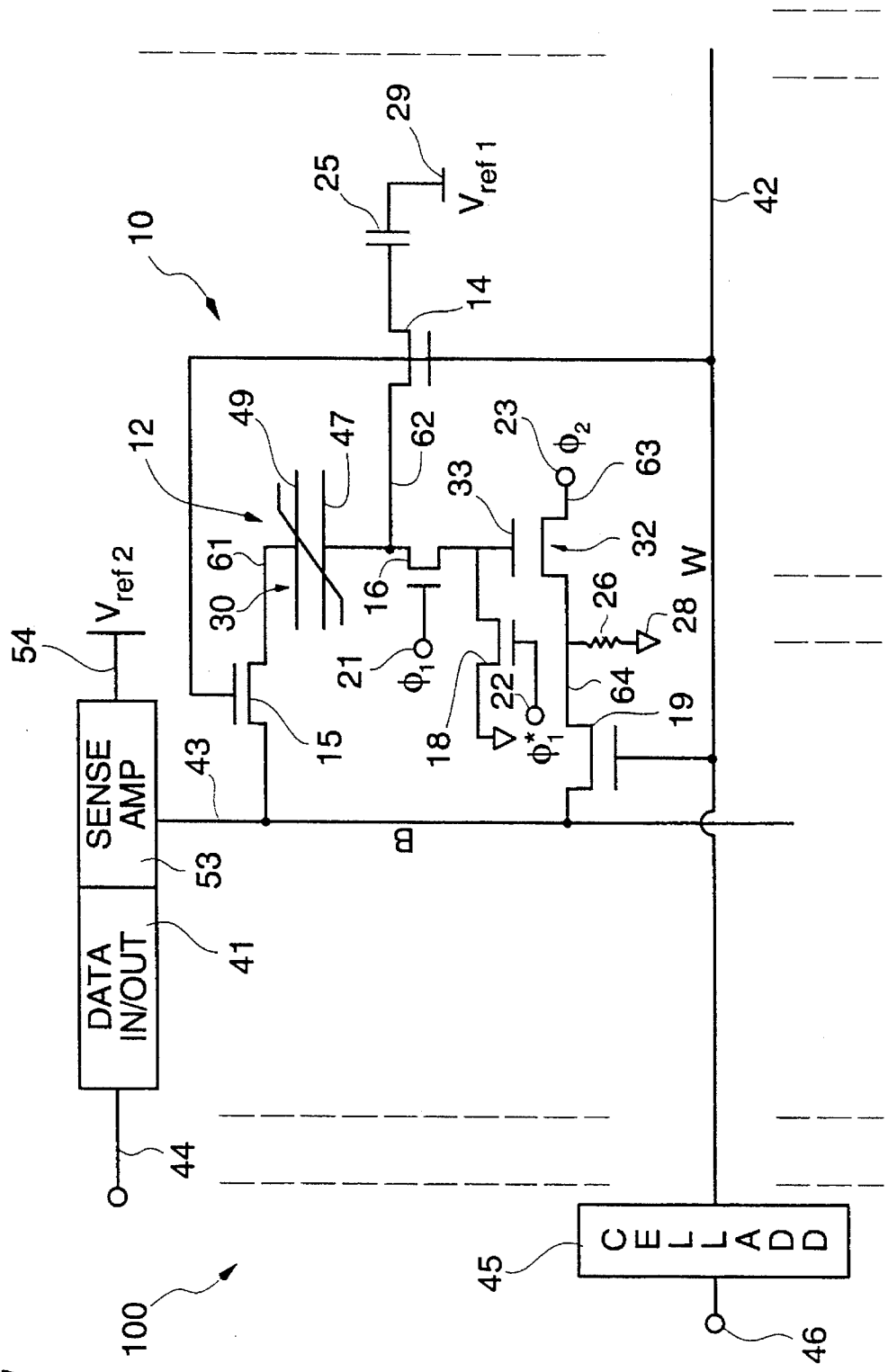
FIG. 1 is an electrical circuit diagram of a non-volatile NDRO memory according to the invention.

A memory 100 according to the invention is shown in FIG. 1. Memory 100 includes a memory cell 10 which comprises a memory unit 12 in which information is stored, plus transistor switches 14, 15, 16, 18, and 19, signal inputs 21, 22, and 23 to operate the memory unit 12, a load capacitor 25, and a load resistor 26. Electronic grounds are indicated by triangles, such as 28. A fixed first reference voltage, Vref1, preferably ½Vdd, is indicated at 29. Memory unit 12 includes a ferroelectric capacitor 30, and a transistor 32. In the embodiment shown in FIG. 1, the ferroelectric capacitor 30 is connected to the gate 33 of transistor 32. As will be described in more detail below, the memory unit 12 is able to store information because the polarization state of capacitor 30 determines the voltage on the gate 33 of transistor 32, thereby changing the current across the transistor 32 and voltage developed across load resistor 26, and thus the voltage output to bit line 43.

The cell 10 is addressed via word line 42 and bit line 43. Word line 42 carries a signal W which is high when the cell is written-to and read and low otherwise. Bit line 43 carries a high voltage when a logic "1" is to be written to capacitor 30 and a zero or low voltage when a logic "0" is to be written to capacitor 30. A high data output signal, i.e. a voltage higher than a second reference voltage, Vref2, which in the embodiments discussed below is about 0.850 volts, is output to bit line 43 if capacitor 30 is in a logic "1" state and when cell 10 is read, and a low data output signal, i.e. a voltage lower than the second reference voltage, is output to bit line 43 if capacitor 30 is in a logic "0" state when cell 10 is read. As is known in the art, cell address circuitry 45 decodes a signal received on address cable 46 to control transistors 14, 15, 16, and 19 appropriately and provide signals φ1, φ1*, and φ2 so as to properly read and write to the cell 10. As is also known in the art, data in/out circuitry 41, decodes data received on data line 44 and provides appropriate signals on bit line 44 to be written to the cell 10, and also differentiates between the data output signal voltages output to bit line 43 to provide a data output signal on data cable 44. A sense amplifier 53 in data in/out circuitry 41 utilizes the second reference voltage, Vref2, input at 54 to differentiate between the data signals output on bit line 43.

As is well-known in the art, a complete memory 100 is composed of an array of memory cells 10 arranged in rows and columns as indicated by the dotted lines in FIG. 1. The word line 42 addresses each of the cells in the same row as the cell 10, while the bit line 43 addresses each of the cells in the same column as cell 10.

As is conventional in the art, an individual cell is addressed when the word line and the bit line in the array corresponding to the cell are simultaneously activated. To write to the particular cell 10 shown in FIG. 1, the word line 42 goes high turning on transistors 14 and 15 thereby connecting first electrode 47 of capacitor 30 to the ½Vdd reference voltage and second electrode 49 of capacitor 30 to bit line 43. If bit line 43 is carrying a high signal, capacitor 30 is polarized in one direction, and if bit line 43 is carrying a low signal, capacitor 30 is polarized in the opposite direction. The signals W, φ1, φ1*, and φ2 are used to place a signal on bit line 43 that is higher than the second reference voltage, Vref2, if the polarization on capacitor 30 is in the logic "1" state and to place a signal on bit line 43 that is lower than the second reference voltage, Vref2, if the polarization of capacitor 30 is in the logic "0" state. The signal φ1* is the inverse of the signal φ1.

As indicated above, the portion of the memory cell 10 that actually stores information is memory unit 12. The memory unit 12 is shown separately in FIG. 2. A feature of the invention is that the memory unit 12 is a four-terminal memory unit. Terminals 61 and 62 are used to write information into the unit, while terminals 63 and 64 are used to read the information from the unit.

Figure 2:
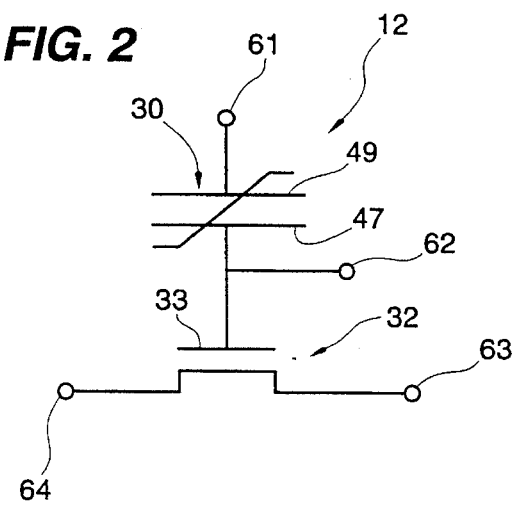
FIG. 2 is an electrical circuit diagram of the memory unit of the memory cell of FIG. 1.
Figure 3:
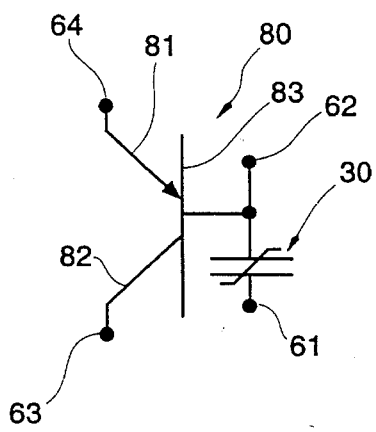
FIG. 3 is an electrical circuit diagram of an alternative embodiment of a memory unit according to the invention.

FIG. 3 shows an embodiment of the memory unit of the invention in which the transistor 80 is a bipolar transistor having an emitter 81, a collector 82, and a base 83. Otherwise the embodiment is the same as that of FIG. 2. The various components that are the same bear the same numerals for clarity. Other types of transistors may also be used.

Figure 4:
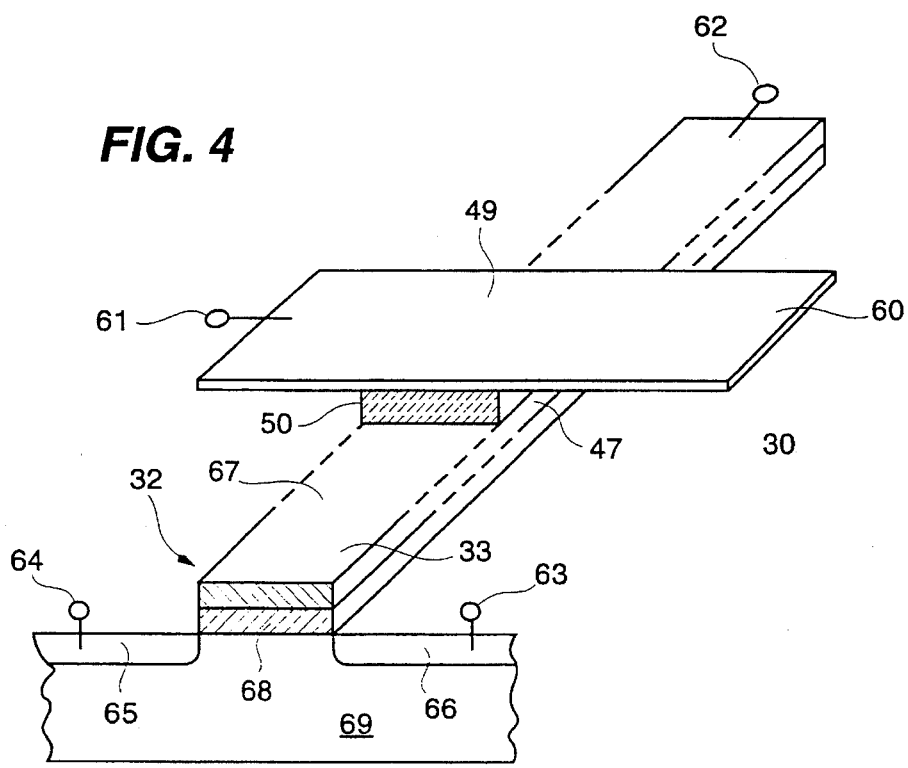
FIG. 4 is a partially perspective and partially cross-sectional view of an integrated circuit implementation of the memory unit of FIG. 2.
Figure 5:
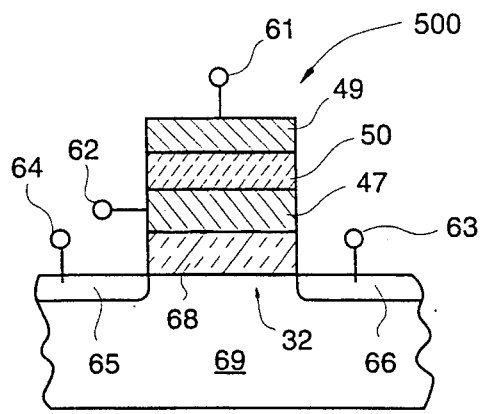
FIG. 5 is a cross-sectional view of another embodiment of an integrated circuit implementation of the memory unit of FIG. 2.

Illustrations of how the circuit of FIG. 2, as it may be embodied in an integrated circuit, are shown in FIGS. 4–8. in the discussion of these embodiments, we shall refer to the doped areas in the substrate, such as 65 and 66 in FIG. 4, in the most general terms as "active regions". In the particular embodiments shown, the active regions are generally referred to as sources and drains since the embodiments show MOSFET transistors. However, as indicated above, the invention can also be embodied in other types of transistors, such as bipolar transistors in which the active areas are referred to as emitters and collectors. Thus, the term "active regions" is used to broadly include all of the terminology conventionally used to refer to such regions in any type of transistor. In the embodiment of FIG. 4, a substrate 69, preferably formed of a single crystal of doped silicon, has active regions 65 and 66 formed in it by doping. As is known in the art, the doping of substrate 69 is opposite to the doping of active regions 65 and 66: one is p-type and the other is n-type. Active regions 65 and 66 are the source and drain of a MOS transistor 32 in this embodiment. The active regions 65 and 66 may also be formed in trenches in the substrate 69 or on the substrate 69 as is known in the art. A gate insulating layer 68 is formed on the substrate 69, and a gate layer 67 is formed on the insulating layer 68. Gate layer 67 is preferably formed of a metal such as platinum but also may be formed of other conductors, such as other metals or doped polysilicon. A layer 50 of a ferroelectric material is formed on the gate layer 67, and a conductive layer 60 is formed on the ferroelectric layer 50. Ferroelectric layer 50 is preferably made of a layered superlattice material as described in U.S. patent application Ser. No. 965,190, but also may be formed of other ferroelectrics. In the examples discussed below, the ferroelectric material 50 was strontium bismuth tantalate. Conductive layer 60 is preferably made of platinum, but also may be made of other suitable conductive materials. As is known in the art, conductive layers 67 and 60 are generally formed of multiple layers of conductive materials which may include an adhesive layer, such as titanium, and a barrier layer, such as titanium nitride. However, these multiple layers are not shown herein since they are not directly related to the invention and may cause confusion. In the embodiment of FIG. 5, the lower electrode 47 of the capacitor 30 is formed of the same conductive layer 67 as the gate 33 of transistor 32. However the ferroelectric material 50 is spaced some distance from the transistor to isolate the two. The four terminals 61–64 are shown schematically, and generally will be implemented as "metallization" layers made of polysilicon, platinum, aluminum or other materials conventionally used for metallization layers in integrated circuits. Each of the layers 60, 47, 67, and 68 is a thin film of from about 500 Å to 4000 Å in thickness. The relative thicknesses of these layers, the active regions 65 and 66, and the substrate 69 are known in the art.

Another embodiment of the memory unit 500 according to the invention is shown in FIG. 5. This embodiment is the same as that of FIG. 4, except the ferroelectric layer 50 and the second electrode 49 are formed in a stack above the transistor 32.

Figure 6:
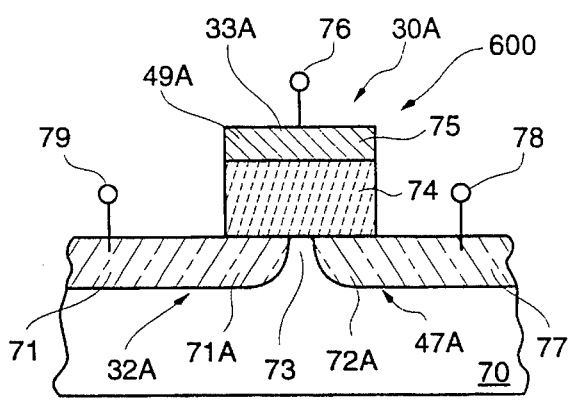
FIG. 6 is a cross-sectional view of a further embodiment of an integrated circuit implementation of the memory unit of FIG. 2.
Figure 7:
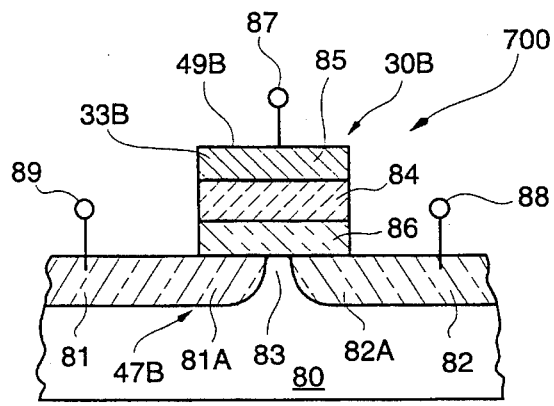
FIG. 7 is a cross-sectional view of yet another embodiment of an integrated circuit implementation of the memory unit of FIG. 2.

Further embodiments of a memory unit 600, 700 according to the invention is shown in FIGS. 6 and 7. These embodiments are closer to the ferroelectric FETs in the prior art and approach the problem of saturating the polarization of the ferroelectric capacitor 30A in a slightly different manner than the embodiments discussed above. In these embodiments source regions 71, 81 and drain regions 77, 82 respectively, are extended under the gate 33A, 33B enabling these heavily doped regions to be utilized as bottom electrodes for a metal-ferroelectric-substrate or metal-ferroelectric-insulator-substrate capacitor. These configurations also eliminate the need for a fourth terminal, i.e. the terminal 62 in FIGS. 1–4. The embodiment of FIG. 6 comprises a substrate 70 in which doped first active region 71 and doped second active region 72 are formed. Preferably, these active regions 71 and 72 are heavily doped as to be highly conductive. A channel region 73 is formed between the active regions 71 and 77. A ferroelectric layer 74 is formed overlying channel region 73, a portion 71A of first active region 71, and a portion 72A of second active region 72. Conductive layer 75 is formed on ferroelectric layer 74 and also overlies channel region 73, portion 71A of first active region 71, and portion 72A of second active region 72. Terminals 76, 78, and 79 connect the conductive layers to external signals as described in reference to FIG. 1. Terminals 78 and 79 also serve the same function as terminal 62 in the embodiments of FIGS. 1–4, as well as the function of terminals 63 and 64. In this embodiment, the first electrode 47A of capacitor 30A is formed from portion 71A of first active region 71 and portion 72A of second active region 72, and gate 33A of transistor 32A is formed of the same conductive member 75 as the second electrode 49A of the ferroelectric capacitor 30A. An important aspect of this embodiment is that the length of channel 73 is much smaller than the width of gate 33A, particularly as compared to prior art ferroelectric FET's in which the length of channel 73 is equal to, or nearly equal to, the gate width. Put another way, as compared to the prior art, the distance in the direction parallel to the ferroelectric layer 74 and the gate/second electrode layer 75 spanned by the channel 73 is short relative to the distance spanned by the first electrode 47A in the same direction, i.e. the horizontal direction in FIG. 6. Preferably, the distance spanned by the first electrode 47A is equal to or greater than the distance spanned by the channel 73. In the prior art, the channel 73 typically spans the entire, or nearly the entire, distance underlying the ferroelectric 74 and gate member 75. Further, the active areas 71 and 72 are highly doped making them very conductive. This combination of the extension of the active areas under the gate to form a first electrode 47A, and the high conductivity performs two functions: 1) It ensures that ferroelectric will be saturated by a write pulse; and 2) It substantially shields the ferroelectric material 74 from fields in the channel 73. Unlike prior art ferroelectric FET devices, the memory unit 600 includes a distinct capacitive function. That is, unit 600 is not just a FET, but is a combination FET 32A and capacitor 30A. Except for the spans of the first electrode 47A and the channel region 73, the dimensions and the materials of the memory unit 600 are within the ranges described above and generally known in the art.

The memory unit 700 according to the invention shown in FIG. 7 is the same as the embodiment of FIG. 6, except that it also includes an insulating layer 86 Since the extensions 81A and 82A provide a definite capacitive function, a lower dielectric constant insulator, such as silicon dioxide, will work better in this embodiment than the prior art, and in some cases is necessary to prevent material compatibility problems. However, preferably a material having a relatively high dielectric constant, such as barium Strontium titanate is used. Preferably the dielectric constant of insulating layer 86 is greater than 50. As in the embodiment of FIG. 6, memory unit 700 only includes three terminals 87, 88, and 89. Terminals 88 and 89 may serve as both the read terminals and the write terminal for the first electrode 47B. The embodiment of FIG. 7 includes a ferroelectric layer 84, a conductive layer 85, and active regions 81 and 82. The first electrode of capacitor 30B comprises portion 81A of first active region 81 and portion 82A of second active region 82. Layer 85 acts as both gate 33B and the second electrode 49B of capacitor 30B. Again the length of channel 83 is much smaller than the width of gate 33B.

In each of the preferred device configurations shown in FIGS. 1–8 above, there are no low dielectric constant materials between the capacitor electrodes 47, 47A, 47B, 49, 49A, 49B, 96 and the ferroelectric material. Further, in each case there are definite capacitor electrodes adjacent the ferroelectric material. Thus, in each case, a saturated polarization can be obtained with conventional integrated circuit voltages. It is also understood that, in each case, after the ferroelectric capacitor is polarized, the terminal 61, 76, 87 connected to the second electrode will at some point be connected to one of the active regions or substrate of the corresponding transistor, or to a reference potential common to such active region or substrate of the corresponding transistor, so that the polarization alters the manner in which the transistor conducts and/or the threshold voltage of the transistor. It has been found that polarizing the capacitor 30, 30A, 30B alters the threshold voltage at which the transistor 32, 32A, 32B conducts such that the conduction of current from the source to the drain is a function of the polarization direction. That is, the transistor threshold voltage can be changed from its value without a ferroelectric polarization present, to new threshold voltage values that depend on the direction of polarization of the ferroelectric capacitor 30, 30A, 30B. This is similar to what others have tried to accomplish in the references discussed in the Background of the Invention section above. However, as will be shown below, testing has shown that, unlike the prior art devices, the devices according to the invention retain their programmed threshold voltage values for at least several weeks.

Figure 9:
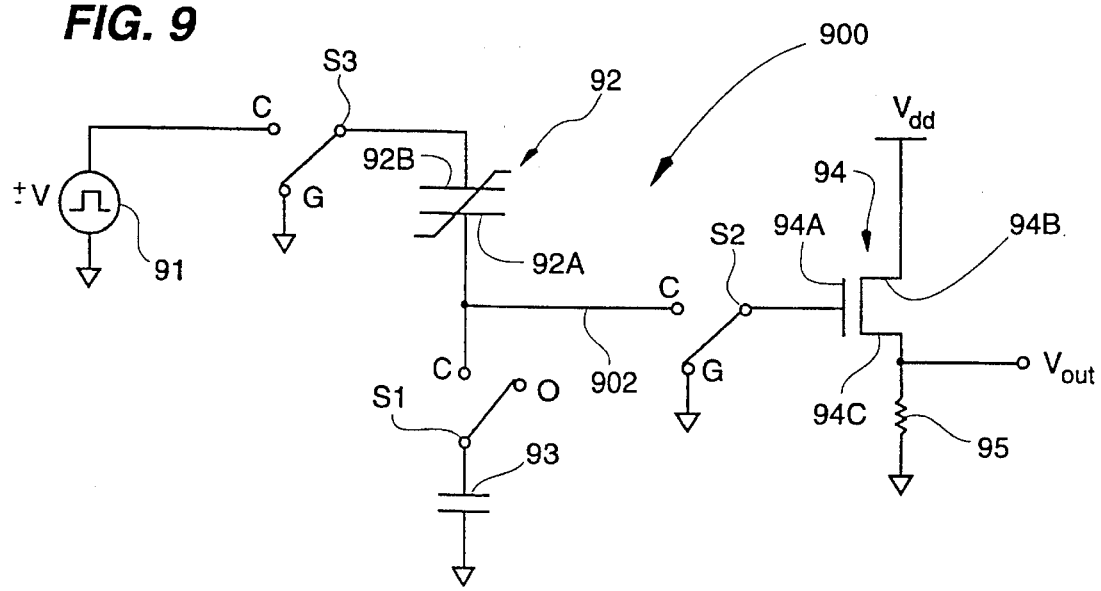
FIG. 9 is an electrical diagram of a memory unit according to the invention and the circuit used to test it.

FIG. 9 shows an electrical circuit which was used to test the invention. The circuit includes a pulsed voltage source or pulser 91, ferroelectric capacitor 92, load capacitor 93, transistor 94, and load resistor 95. One electrode 92B of ferroelectric capacitor 92 is connected to pulser 91 via switch S3 and the other electrode 92A is connected to ground through switch S1 and load capacitor 93 and to the gate 94A of transistor 94. The drain 94B of transistor 94 is connected to a voltage source Vdd, and the source 94C of the transistor 94 is connected to ground through a load resistor 95. As indicated in the drawing, the top electrode 92B is connected to ground when switch S3 is in the ground position G and connected to the pulser 91 when switch S3 is in the closed position C. The bottom electrode 92A is connected to ground when switch S1 is in the closed position C and is connected to the gate 94A of transistor 94 when switch S2 is in the closed position C. When switch S2 is in the ground position G, the gate 94A is connected to ground. The substrate on which the ferroelectric capacitor was fabricated was connected to ground through a 24 picofarad capacitor to keep the test circuit from floating. The ferroelectric capacitor 92 was 500×500 micrometer squared in area and had an approximate thickness of 1700 Å. The ferroelectric material was strontium bismuth tantalate. Load capacitor 93 was 140 nanofarads, transistor 94 was an n-channel, depletion mode type, and resistor 95 was 1 kilohm. The drain voltage Vdd was adjusted to obtain an output reference voltage, Vout, of 0.850 volts when the switch S2 was connected to ground, that is, when the gate 94A was held at ground.

Figure 10:
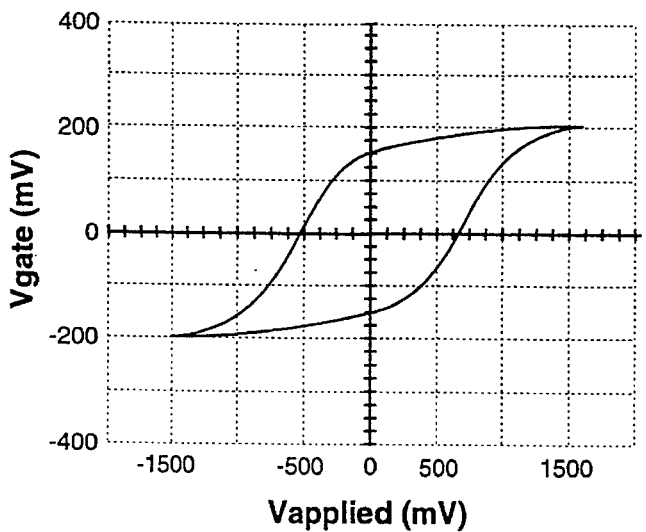
FIG. 10 is a hysteresis curve measured on the circuit of FIG. 9 utilizing the voltage tapped off the top electrode of the ferroelectric capacitor as the x-axis and the voltage tapped of the gate side of the switch S2 as the y-axis.
Figure 11:
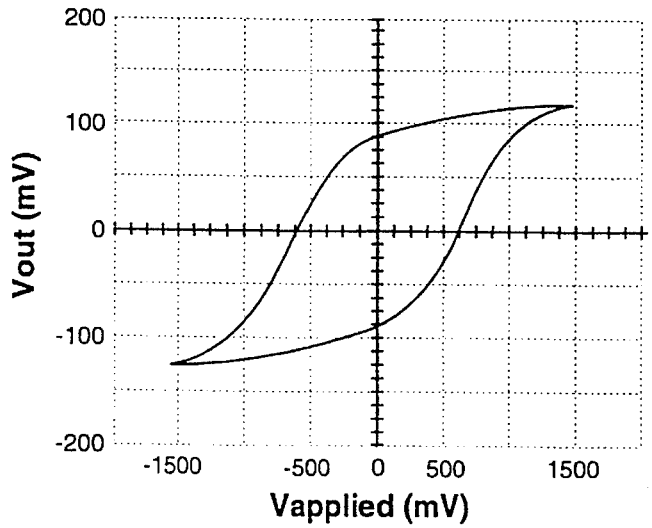
FIG. 11 is a hysteresis curve measured on the circuit of FIG. 9 utilizing the voltage tapped off the top electrode of the ferroelectric capacitor as the x-axis and the voltage $V_{out}$ as the y-axis.

Hysteresis curves were obtained for the above circuit by replacing the pulser 91 with a signal generator and performing a compensated Sawyer-Tower hysteresis measurement using a triangular signal of 1 kilohertz frequency. Switches S1, S2, and S3 were closed. The x-axis voltage was tapped off the top electrode 92B of ferroelectric capacitor 92. The hysteresis curve of FIG. 10 was obtained when the y-axis voltage was tapped off the gate side of switch S2, and the hysteresis curve of FIG. 11 was obtained when the y-axis voltage was Vout. The voltage in each of the curves is in millivolts (mV). Both curves are relatively boxy and vertical, indicating a fully saturated response that should produce good memory performance.

Figure 12:
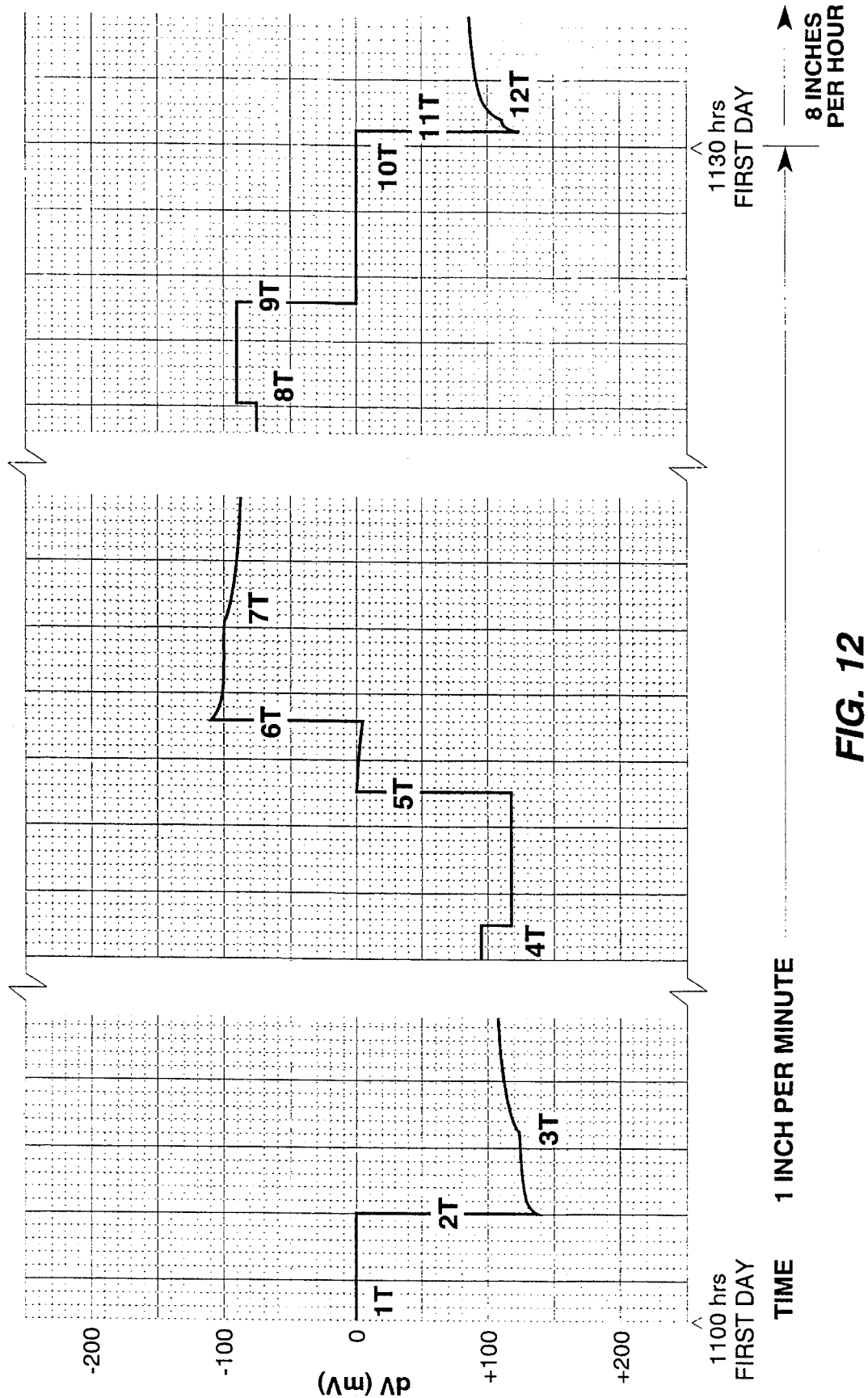
FIGS. 12 and 13 are a graph of change in voltage, dV, versus time measured in a test of the circuit of FIG. 9.
Figure 13:
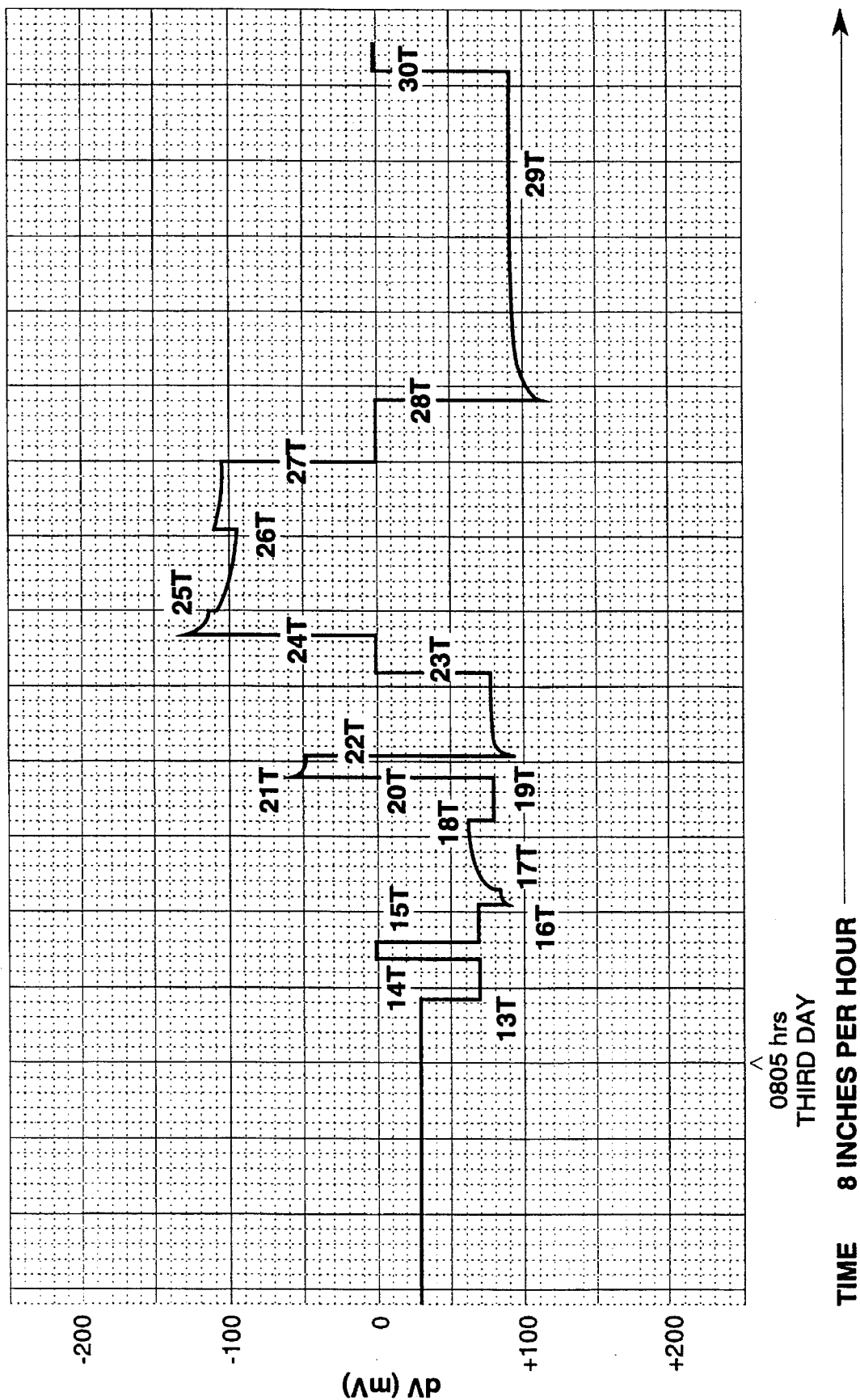

A time retention test was run on the test circuit of FIG. 9 with the results shown in FIGS. 12 and 13. Along the y-axis the voltage differential, dV, measured at Vout is shown, dV being the difference between the reference voltage of 0.850 volts and the measured voltage. The x-axis shows the time in military time, beginning at 1100 hours on the first day. The time scale is "broken" at two points on FIG. 12 and between FIG. 12 and FIG. 13 to fit the chart on two pages. The initial time scale is 1 inch per minute, but at 11:30 a.m. on the first day the scale is changed to 8 inches per hour. At point 1T the ferroelectric capacitor was "reset" by closing switch S1, switching switch S3 to ground, and closing switch S2. The node 902 was then manually taken to ground for a brief time to ensure that the electrodes 92A and 92B were at the same ground potential. This put both sides of capacitors 92 and 93 and the gate 94A of transistor 94 at ground. At point 2T a +1.5 volt pulse of 1 microsecond duration was applied to the circuit by pulser 91. A positive dV of about 130 millivolts was recorded across resistor 95 at Vout. The signal across the resistor 95 began to decay. At point 3T switch S1 was opened to remove the load capacitor from the circuit, and switch S3 was switched to ground to ground the top electrode 92B of the ferroelectric capacitor 92. At point 4T switch S1 was closed to put the load capacitor back in the circuit. At point 5T the circuit was reset, and at point 6T a negative pulse of −1.5 Volts was applied by Pulser 91. At point 7T, S3 was switched to ground and S1 was switched to open. At point 8T, S1 was closed, and at point 9T the circuit was again reset by closing S1 and S2 and grounding S3. At point 10T the scale was changed to 8 inches per hour. At point 11T a positive 1.5 volt pulse was applied, and at point 12T, S1 was opened and S3 was grounded. Turning to FIG. 13, a long term test was now run, and it was found that the signal across the resistor 95 dropped to about half its original value in a period of about 20½ hours. While this test showed a retention of the information for about two days, this was not sufficient for a non-volatile memory. It was believed that the decay was caused by leakage via a ground loop through the transistor 94. A second test was run that was essentially the same except that it was run at only one polarization and the transistor 94 was disconnected from the capacitor 92 by switching switch S2 to ground for most of the test. Periodically, S2 was closed to sample the voltage at the bottom electrode 92D. The voltage also decreased in this test, but much more slowly, taking approximately seven days to decay from 0.0960 volts to 0.0630 volts. Thus this device retained its memory for a substantially longer period than any prior art ferroelectric FET device.

Figure 14:
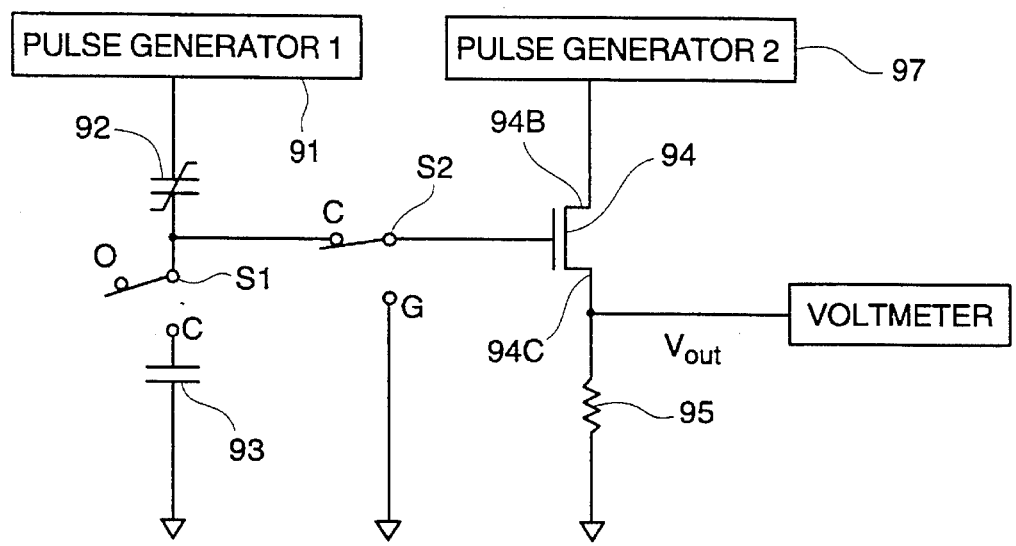
FIG. 14 is an electrical diagram of a memory unit according to the invention and another circuit used to test it.

To further test the invention, a circuit with two pulse generators was built as shown in FIG. 14. This circuit is the same as that of FIG. 9, except that only two switches, S1 and S2 are used and the voltage source Vdd was replaced by a second pulse generator 97. A 500×500 micrometer squared capacitor utilizing strontium bismuth tantalate as the ferroelectric material was again used along with an n-type depletion mode transistor 94 having drain 94B and source 94C, a 140 nanofarad load capacitor 93, and a 1 kilohm load resistor 95. Again the system was initialized by turning switch S2 to ground and setting Vout to be 850 millivolts. In this case, however, the capacitor 92 was polarized with ±5 volt rectangular pulses from the first pulse generator 91, with S1 and S2 both closed. SW1 was then opened and rectangular pulses of 0.5 Hertz were periodically applied via the second pulse generator 97. Again dV=Vout−0.850 volts was measured. The results are shown in FIG. 15.

Figure 15:
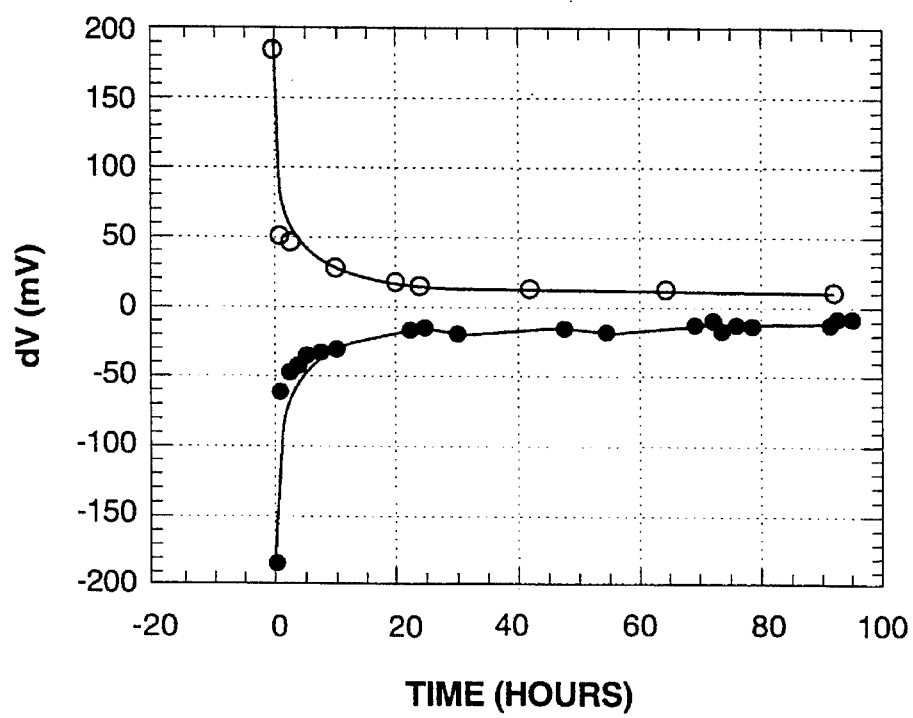
FIG. 15 is a time versus voltage curve showing the retention of a measurable polarization state by the memory unit tested in FIG. 12 for nearly 100 hours.

As shown in FIG. 15, dV was periodically measured over a 93 hour period for the case of polarization with a positive pulse, and over a 95 hour period for the case of polarization with a negative pulse. In each case, the voltage decayed exponentially at first, then settled down to a slowly decaying value of about 10 millivolts in the case of the positive polarization and about 15 millivolts in the case of the negative polarization. These curves suggest that the voltage difference between the positive polarization and the negative polarization cases would continue to be measurable for several months. Thus this device and measurement technique have been shown to permit a practical non-volatile memory, as for example a memory that was refreshed each time it was turned on or off.

It should be understood that the test circuits, as well as the circuit of FIG. 1 may be made in a variety of different configurations than those shown. For example, the voltage to which first electrode 92A is connected when the capacitor 92 is being polarized and the voltage to which the gate 94A is connected when the system is being initialized, do not have to be a ground. They may be any constant voltage source that can provide a "zero" reference for the capacitor and gate.

The memory unit 12 according to the invention can take on many different configurations than the configuration shown in FIGS. 2 and 3. Some of the possible configurations are shown in FIG. 16 through 21. It is understood that each of these memory units 160, 170, 180, 190, 210, and 220 are to be incorporated into a memory circuit, such as that shown in FIG. 1, to make an operable memory. FIG. 16 shows an memory unit 160 that includes a ferroelectric capacitor 161, a first MOS transistor 163, and a second MOS transistor 164. The ferroelectric capacitor 161 is connected to the gate 162 of the first MOS transistor, and the drain 166 of the first transistor is connected to the drain 167 of the second transistor.

FIG. 17 shows a memory unit 170 comprising first ferroelectric capacitor 171, second ferroelectric capacitor 172, first MOS transistor 175, and second MOS transistor 176. The first ferroelectric capacitor 171 is connected to the gate of the first transistor 175, while the second ferroelectric capacitor 172 is connected to the gate of the second transistor 176. The drains of the transistors 175 and 176 are connected together.

FIG. 18 shows a memory unit 180 comprising first ferroelectric capacitor 181, second ferroelectric capacitor 182, first MOS transistor 183, and second MOS transistor 184. The first ferroelectric capacitor 181 is connected to the gate of the first transistor 183, while the second ferroelectric capacitor 182 is connected to the gate of the second transistor 184. The drains of the transistors 183 and 184 are connected together as are the sources.

FIG. 19 shows a memory unit 190 comprising ferroelectric capacitor 191, p-channel MOS transistor 192, and n-channel MOS transistor 193. The two transistors 192 and 193 comprise a CMOS pair. The ferroelectric capacitor 191 is connected to the gates of both transistors 192 and 193 and the drains of the transistors 192 and 193 are connected together.

Figure 21:
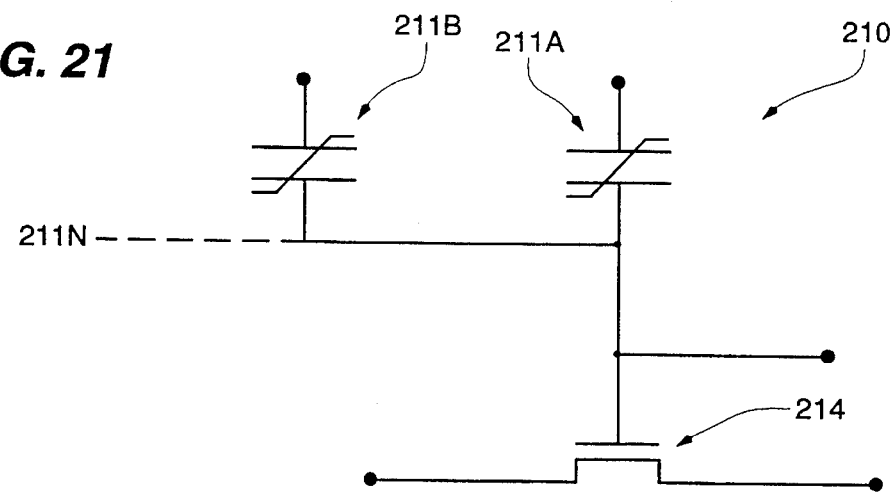

FIG. 20 shows a memory unit 200 comprising a CMOS pair of transistors 204 and 205 and N ferroelectric capacitors 201A, 201B ... 201N. Each capacitor is connected to the gates of the transistors 204 and 205. FIG. 21 shows a memory unit 210 including N ferroelectric capacitors, 211A, 211 B, .... 211N and a single MOS transistor 214. Each of the N capacitors 211A, 211B, ... 211N are connected to the gate of the transistor 214. These two embodiments lend themselves to a neural network in which each of the capacitors, such as 221A, 221 B, ... 221N provides a synaptic weight, which weights are integrated by the transistor pair 224, 225 or transistor 214.

In each of the examples shown above in FIGS. 16 through 21 the ferroelectric capacitors are connected into the circuit and fabricated in an integrated circuit such that their polarization states can be saturated. Moreover, it is understood that following polarization, each of the ferroelectric capacitors are connected into a circuit such that the electrode not connected to the gate of the transistor, i.e. the second electrode, is connected to an active region or substrate of the transistor so that the capacitor polarization alters the manner in which the transistor conducts and/or the threshold voltage of the transistor. As is known in the art, this can be accomplished in many ways, such as by connecting both the capacitor second electrode and the appropriate active region or substrate to ground, to the same reference voltage, etc.

Figure 22:
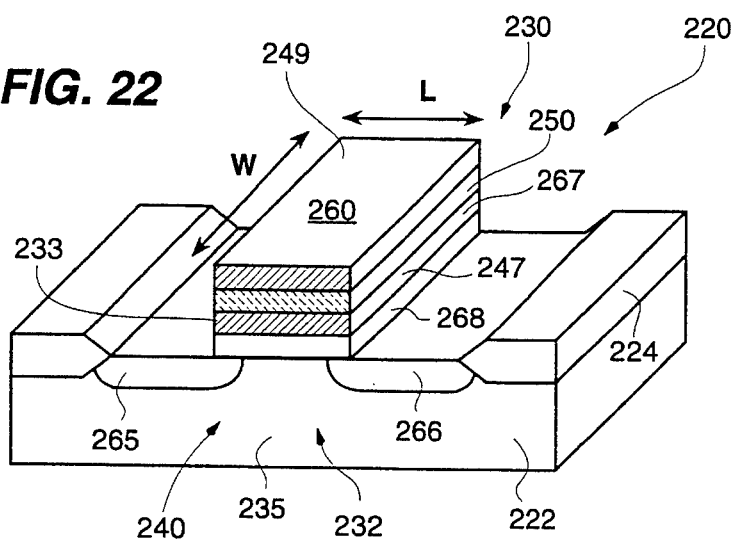
FIG. 22 is a perspective view of an exemplary memory unit according to the invention on which various dimensions are labeled.
Figure 23:
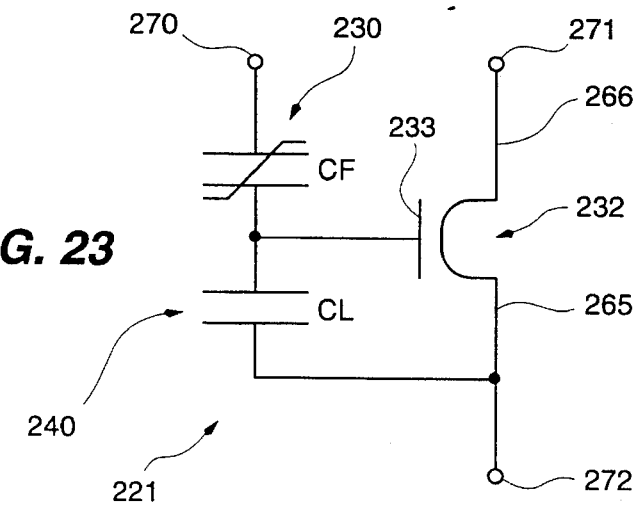
FIG. 23 is an equivalent circuit of the memory unit of FIG. 22.

FIG. 22 shows a perspective view of a memory unit 220 according to the invention which will be useful in a discussion below of the preferred parameters of the memory unit structure. The memory unit 220 is fabricated on a silicon substrate 222, and includes field oxide regions 224, transistor 232 and ferroelectric capacitor 230. The transistor 232 includes a source 265 and drain 266 formed by doped regions in silicon substrate 222, gate oxide layer 268, and gate 233 formed of conductive layer 267. Ferroelectric capacitor includes first electrode 247, also formed of conductive layer 267, ferroelectric layer 250, and second electrode 249 formed of conducting layer 260. FIG. 23 shows an equivalent circuit 221 of the memory unit 220. Equivalent circuit 221 includes ferroelectric capacitor 230, load capacitor 240 and transistor 232. The load capacitance of the unit 220 is dominated by the gate capacitance of the transistor, that is the capacitance between the gate 233 and the channel region 235 of the transistor 232. The circuit 221 can also be considered to be an equivalent circuit to the test circuit of FIG. 14 with switches S1 and S2 closed, since, in FIG. 14, one side of load resistor 93 and the source 94C of transistor 94 are connected to ground.

The success of the above-described experiments can also be attributed to the fact that the preferred embodiments of the invention include certain preferred relationships between the relative magnitude of the capacitance, CF, of the ferroelectric capacitor 230 and the capacitance, CL, of the load capacitor 240. The relative magnitudes of these capacitors largely determines the voltage that is available to switch the polarization of ferroelectric capacitor 230. If a voltage Va is applied terminal 270 (FIG. 23) and terminal 271 is connected to ground then the voltage Va=Vf+Vl, where Vf is the voltage across ferroelectric capacitor 230 and Vl is the voltage across load capacitor 240. If one defines the ratio of the ferroelectric and load capacitances as Rc=Cf/Cl, then since the charge on each capacitor is the same, and C=Q/V, where C is the capacitance of a capacitor having a voltage, V, across it and a charge, Q, on it, therefore:

$$Vf=Va/(1+Rc). \tag{1}$$

Usually the load capacitance of a device as shown in FIG. 22 will be dominated by the gate capacitance of the transistor 232, i.e. $Cl=Cg=\epsilon_0 \epsilon_g Ag/c$, where $\epsilon_0$ is the permittivity in vacuum, $\epsilon_g$ is the dielectric constant of the gate oxide 268, Ag is the effective area of the gate capacitor, and c is the thickness of the gate oxide layer 268. Likewise, $Cf=\epsilon_0 \epsilon f Af/t$, where $\epsilon f$ is the dielectric constant of the ferroelectric capacitor 230, and Af and t are the area and thickness, respectively, of the ferroelectric capacitor 230. Thus, $$Rc = Cf/Cg = \epsilon f Afc/\epsilon g Agt. \qquad (2)$$

Referring to FIG. 23, Ag=Wb, where W is the channel width and is indicated in FIG. 23, and b is the amount the gate 233 overlaps the source 265 and drain 266. Also Af=WL, where L is the length of the ferroelectric capacitor 230. Typical parameters selected from prior art ferroelectric memory devices would be: $\epsilon g=4$, $\epsilon f=200$, L=2 micrometers, b=0.2 micrometers, c=100 Å, and t=2000 Å. Inserting these values into equation (2) one gets Rc=25, and using equation (1), Vf=Va/26. To reverse the polarization of a 2000 Å ferroelectric capacitor takes at least 1 volt, usually more. Thus the conventional parameters with conventional geometries would require a Va of more than 25 volts. State-of-the-art integrated circuit memories usually utilize voltages of 5 volts or less. Thus with conventional geometries and materials, the memory unit 220 of FIG. 22 would not be a practical device. However, utilizing materials such as strontium bismuth tantalate for the ferroelectric capacitor, one can reduce the dimension "L" to about 0.4 micrometers, and still obtain good switching. All other parameters remaining the same, this produces an Rc of about 5. In conventional integrated circuit transistors, b, the amount the gate 233 overlaps the source 265 and drain 266, is about the same as the channel or junction depth, a. As shown in FIG. 22, "a" is approximately the depth source 265 and drain 266 penetrate into substrate 222. However, as discussed above, in the device according to the invention, b is preferably made larger, for example as shown in FIGS. 6 and 7. Thus, if at the same time as decreasing L, b is increased to a reasonably larger value, say 0.4 micrometers, then an Rc of about 2.5 is reached. These values permit a device to be built that will work with the usual integrated circuit memory voltages. If in addition, instead of the gate oxide 268 being the conventional silicon dioxide, having a dielectric constant of about 4, one utilizes an insulator with a higher dielectric constant, say tantalum oxide, $Ta_2O_5$, which has a dielectric constant of about 25, the value of Rc can be reduced to 0.4, which should easily permit a practical, workable memory device.

From the above discussion it is seen that in the preferred integrated circuit devices 220 according to the invention, the capacitance Cf of the ferroelectric capacitor 230 should be less than five times the load capacitance, i.e. Cf<5×Cl, or in other words, the ratio of the ferroelectric and load capacitances, Rc, should be less than or equal to 5, i.e., Rc<5. In terms of the gate capacitance, preferably the area of the ferroelectric capacitor, Af, is less than or equal to twice the area of the gate capacitor, Ag, which is defined as Ag=b×W, where b is the gate overlap and W is the channel width. That is, Af≦2Ag. In general, this means that b≧a, where a is the channel or junction depth. Also, preferably, the dielectric constant of the gate insulator 268, is preferably greater than the dielectric constant of silicon dioxide, i.e. greater than 4, that is, $\epsilon g>4$. Put another way, preferably, the dielectric constant, $\epsilon g$, of the gate insulator is preferably greater than or equal to the dielectric constant, $\epsilon f$, divided by 8, i.e. $\epsilon g \geq \epsilon f/8$. This value, coupled with the other preferred parameters will generally provide a practical memory unit 220.

Figure 8:
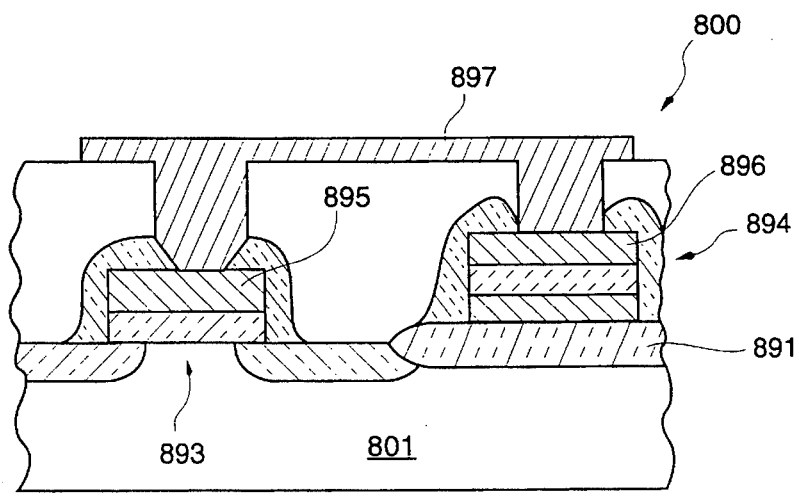
FIG. 8 is a cross-sectional view of an embodiment of an integrated circuit implementation of the memory unit of FIG. 2 in which the capacitor is fabricated on the integrated circuit field oxide.

The above discussion indicates that if the relative parameters of the transistor 232 and the ferroelectric capacitor 230 in the memory unit 220, are selected properly, almost any memory cell architecture is possible. For example, the ferroelectric capacitor may be fabricated on the field oxide 224 of the cell rather than directly overlaying the transistor 232 as discussed above, if the preferred parameters are used. Such a structure is shown in FIG. 8. In the architecture of FIG. 8, the memory unit 800 comprises transistor 893 and capacitor 894 which are fabricated according to the above parameters. The capacitor 894 is fabricated on field oxide 891 which is conventionally grown on substrate 801. Transistor gate 895 and capacitor electrode 896 are connected via a wiring layer 897. Other details of the structure, such as the other connections to the transistor 893 and capacitor 894 are not shown for clarity. Thus, while the structures described with reference to FIGS. 4–7 and 22 are highly desirable, they are not necessary, if the unit cell structure utilizes the preferred relative dimensions and other parameters. Fabrication of the capacitor on the field oxide permits better isolation of the ferroelectric material from the transistor. Thus, use of the parameters of the invention enables ferroelectric materials that are less compatible with conventional integrated circuit technology to be used more successfully. However, when the ferroelectric material is compatible with conventional integrated circuit transistor technology, the combination of the architectures of FIGS. 4–7 and 22 in combination with the parameters of the invention is preferred.

There has been described a non-volatile memory that includes a ferroelectric memory unit that includes a combination of a ferroelectric capacitor and transistor and that provides saturated polarization and has many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that it has been disclosed how to provide saturated polarization in a ferroelectric FET or other ferroelectric memory device, other devices that use the principle of the invention may also be designed. It is also evident that the memory units according to the invention may be used with other memory cell and memory architectures. Equivalent structures, materials and process may be substituted for the various structures, materials and processes described.

We claim:

1. A ferroelectric non-volatile, non-destructive read-out memory unit comprising a ferroelectric capacitor having a first electrode, a second electrode, and a ferroelectric material between said first and second electrodes, a transistor having a gate, said first electrode of said capacitor connected to said gate of said transistor, a bit line for carrying a data signal, and means for applying said bit line data signal to said second electrode of said capacitor.

2. A ferroelectric, non-volatile, integrated circuit memory unit comprising:

a transistor comprising first and second active regions, a channel region between said first and second active regions, and a conductive gate layer; and a ferroelectric capacitor comprising a first electrode comprising a portion of at least one of said first active region and said second active region, said first electrode underlying said conductive gate layer, a second electrode comprising said conductive gate layer, and a ferroelectric layer between said first electrode and said second electrode, wherein said first electrode spans a distance in a direction parallel to said conductive gate layer that is greater than the distance spanned by said channel region in said direction.

3. A ferroelectric, non-volatile, integrated circuit memory unit as in claim 2 wherein said first electrode comprises a portion of said first active region and a portion of said second active region.

4. A memory unit as in claim 3 wherein said transistor is a MOS transistor, said first active region comprises a source, and said second active region comprises a drain.

5. A memory unit as in claim 2 and further including a substrate, and wherein said first electrode comprises a doped area of said substrate.

6. A memory unit as in claim 2 and further comprising an insulating layer between said ferroelectric layer and said first electrode, said insulating layer having a dielectric constant greater than 50.

7. A ferroelectric, non-volatile, integrated circuit memory unit comprising a transistor comprising first and second active regions, a channel region between said first and second active regions, a conductive gate layer, and a ferroelectric material between said channel region and said conductive gate layer, wherein said first and second active regions extend under said ferroelectric layer and conductive gate layer a sufficient distance to polarize said ferroelectric material to saturation with a voltage of less than 10 volts applied between said conductive gate layer and said first and second active regions.

8. A memory unit as in claim 7 wherein the distance said first and second active regions extend under said conductive gate layer exceeds the distance spanned by said channel region in a direction parallel to said conductive gate layer.

9. A ferroelectric non-volatile, integrated circuit memory unit comprising a ferroelectric capacitor having a first electrode, a second electrode, and a ferroelectric material between said first and second electrodes, a transistor having a gate having a gate capacitance $C_g$, said first electrode of said capacitor connected to said gate of said transistor, said ferroelectric capacitor having a capacitance $C_f$ and said memory unit having a load capacitance $C_l$ comprising said gate capacitance $C_g$, wherein $C_f < 5 \times C_l$.

10. A ferroelectric non-volatile, integrated circuit memory unit as in claim 9 wherein $C_f < 2 \times C_l$.

11. A ferroelectric non-volatile, integrated circuit memory unit as in claim 9 wherein said integrated circuit includes a field oxide layer and said capacitor is fabricated on said field oxide.

12. A ferroelectric non-volatile, integrated circuit memory unit comprising a ferroelectric capacitor having a first electrode, a second electrode, and a ferroelectric material between said first and second electrodes, a transistor having a gate, a source and a drain forming a gate capacitor having an area $A_g$, said first electrode of said capacitor connected to said gate of said transistor, said ferroelectric capacitor having an area $A_f$, and wherein $A_f \leq 2A_g$.

13. A ferroelectric non-volatile, integrated circuit memory unit as in claim 12 wherein $A_f \leq A_g$.

14. A ferroelectric non-volatile, integrated circuit memory unit as in claim 12 wherein said integrated circuit includes a field oxide layer and said capacitor is fabricated on said field oxide.

15. A ferroelectric non-volatile, integrated circuit memory unit comprising a ferroelectric capacitor having a first electrode, a second electrode, and a ferroelectric material between said first and second electrodes, a transistor having a gate, a source and a drain, said gate overlapping said source and drain by a distance b, said transistor having a channel depth a, and wherein $b > a$.

16. A ferroelectric non-volatile, integrated circuit memory unit as in claim 15 wherein $b \geq 2a$.

17. A ferroelectric non-volatile, integrated circuit memory unit as in claim 15 wherein said integrated circuit includes a field oxide layer and said capacitor is fabricated on said field oxide.

18. A ferroelectric non-volatile, integrated circuit memory unit comprising a ferroelectric capacitor having a first electrode, a second electrode, and a ferroelectric material between said first and second electrodes, a transistor having a gate and a gate insulator, said first electrode of said capacitor connected to said gate of said transistor, said ferroelectric material having a dielectric constant $\epsilon_f$ and said gate insulator having a dielectric constant $\epsilon_g$, and wherein $\epsilon_g \geq \epsilon_f/8$.

19. A ferroelectric non-volatile, integrated circuit memory unit as in claim 18 wherein $\epsilon_g \geq \epsilon_f/4$.

20. A ferroelectric non-volatile, integrated circuit memory unit as in claim 18 wherein said integrated circuit includes a field oxide layer and said capacitor is fabricated on said field oxide.

21. A ferroelectric non-volatile, integrated circuit memory unit comprising a ferroelectric capacitor having a first electrode, a second electrode, and a ferroelectric material between said first and second electrodes, a transistor having a gate and a gate insulator, said first electrode of said capacitor connected to said gate of said transistor, and said gate insulator having a dielectric constant greater than 4.

* * * * *